(12) United States Patent
McMahon et al.

(10) Patent No.: US 10,154,740 B2
(45) Date of Patent: Dec. 18, 2018

(54) ELECTRONIC DISPLAY CABINET

(71) Applicant: Daktronics, Inc., Brookings, SD (US)

(72) Inventors: Peter McMahon, Elkton, SD (US); Pat Lilla, Brookings, SD (US); Josh Pommer, Brookings, SD (US); Jeff Holm, Volga, SD (US); John W. Syrstad, Rutland, SD (US)

(73) Assignee: Daktronics, Inc., Brookings, SD (US)

( * ) Notice: Subject to any disclaimer, the term of this patent is extended or adjusted under 35 U.S.C. 154(b) by 683 days.

(21) Appl. No.: 14/668,560

(22) Filed: Mar. 25, 2015

(65) Prior Publication Data

US 2015/0282376 A1 Oct. 1, 2015

Related U.S. Application Data

(60) Provisional application No. 61/970,043, filed on Mar. 25, 2014.

(51) Int. Cl.
*A47F 10/00* (2006.01)
*H05K 7/20* (2006.01)

(52) U.S. Cl.
CPC .......... *A47F 10/00* (2013.01); *H05K 7/20181* (2013.01)

(58) Field of Classification Search
CPC .............................. A47F 10/00; H05K 7/20181
USPC ......................................................... 454/184
See application file for complete search history.

(56) References Cited

U.S. PATENT DOCUMENTS

| | | | | |
|---|---|---|---|---|
| 4,412,478 A | * | 11/1983 | Osher | F24F 7/007 248/222.51 |
| 5,409,191 A | * | 4/1995 | Wenmaekers | E04B 9/006 248/317 |
| 6,476,883 B1 | * | 11/2002 | Salimes | H05K 5/0017 345/156 |
| 7,694,444 B2 | * | 4/2010 | Miller | H05K 7/183 40/446 |
| 7,926,213 B1 | * | 4/2011 | Kludt | F16B 2/12 40/605 |
| 8,327,591 B2 | * | 12/2012 | Wilkinson, Jr. | G09F 7/18 52/238.1 |
| 8,590,184 B2 | * | 11/2013 | Safavi | G09F 9/33 40/549 |
| 8,702,048 B2 | * | 4/2014 | Kludt | F16B 2/12 248/222.14 |
| 8,929,083 B2 | * | 1/2015 | Cox | H05K 7/20963 312/223.5 |
| 9,230,458 B2 | * | 1/2016 | Cox | H05K 7/20963 |
| 9,414,516 B2 | * | 8/2016 | Chin | H05K 7/20145 |
| 2009/0056186 A1 | * | 3/2009 | Pitcher | G09F 7/18 40/617 |

(Continued)

*Primary Examiner* — Gregory Huson
*Assistant Examiner* — Ryan Faulkner
(74) *Attorney, Agent, or Firm* — Schwegman Lundberg & Woessner, P.A.

(57) ABSTRACT

A cabinet system having a protective shroud and an external frame with a linear track. The protective shroud provides a protected inner space shielded from moisture and airborne contaminants. The cabinet system also includes a mounting assembly having a mounting arm that can be affixed to a support structure and also having a mounting foot slidably engaged to the at least one track. The mounting foot can be fixed at positions along the linear track allowing the cabinet to be mounted at different position relative to the support structure.

16 Claims, 18 Drawing Sheets

(56) References Cited

U.S. PATENT DOCUMENTS

| | | | | |
|---|---|---|---|---|
| 2009/0126914 A1* | 5/2009 | Dunn | ............... | H05K 7/20972 |
| | | | | 165/121 |
| 2009/0229154 A1* | 9/2009 | Sadon | ............... | G09F 9/33 |
| | | | | 40/546 |
| 2009/0244472 A1* | 10/2009 | Dunn | ............... | G02F 1/133385 |
| | | | | 349/161 |
| 2010/0296245 A1* | 11/2010 | Dunn | ............... | H05K 7/20972 |
| | | | | 361/695 |
| 2011/0051367 A1* | 3/2011 | Nakamichi | ............... | H05K 7/20972 |
| | | | | 361/690 |
| 2013/0171921 A1* | 7/2013 | Nakamichi | ............... | H05K 5/0213 |
| | | | | 454/184 |
| 2013/0279090 A1* | 10/2013 | Brandt | ............... | H05K 7/00 |
| | | | | 361/679.01 |

\* cited by examiner

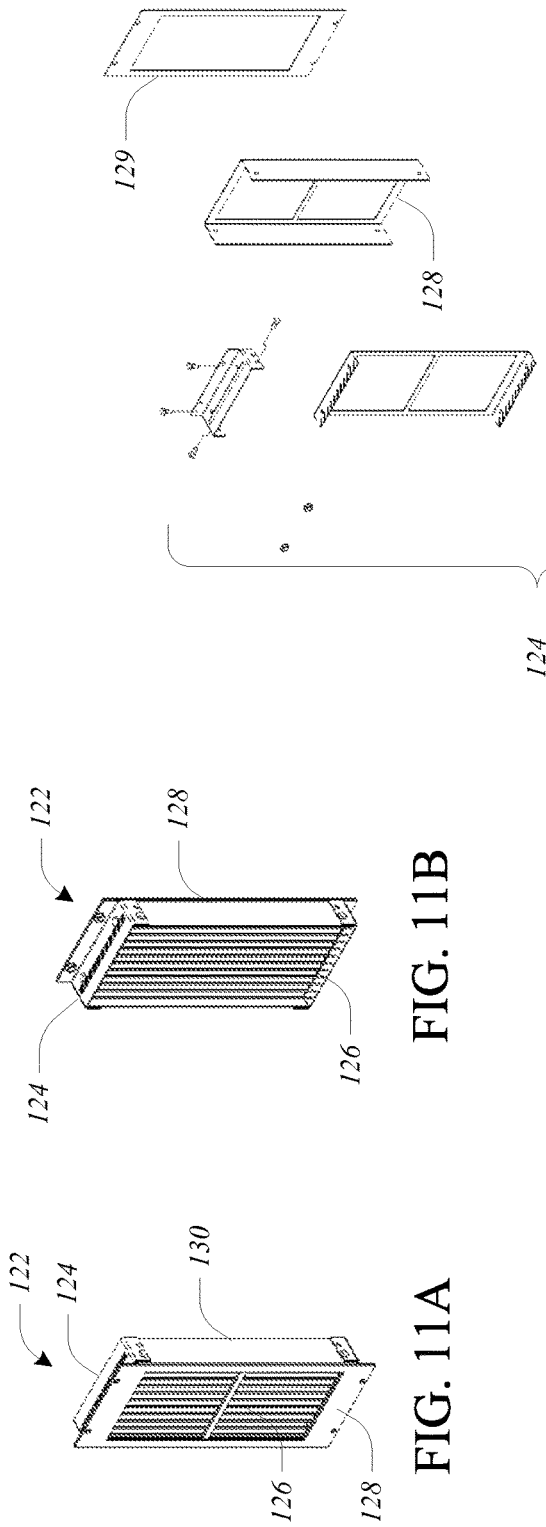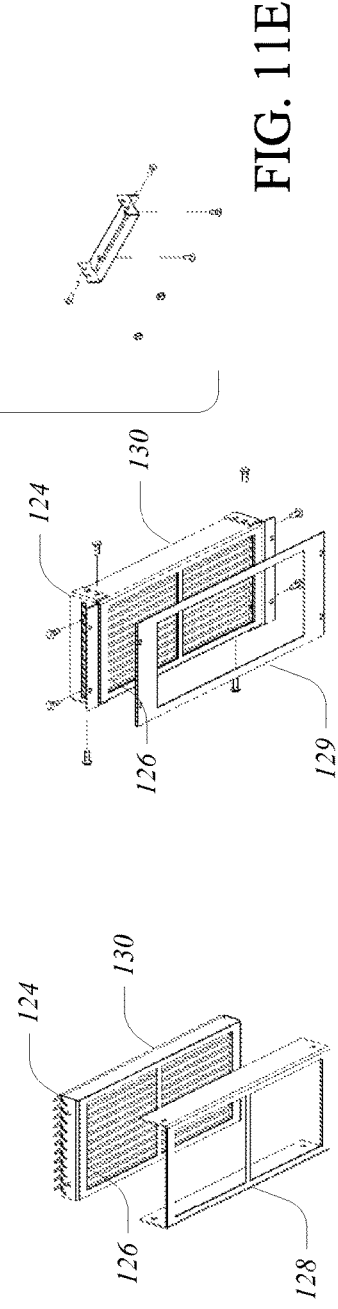
FIG. 11A FIG. 11B FIG. 11C FIG. 11D FIG. 11E

FIG. 17A
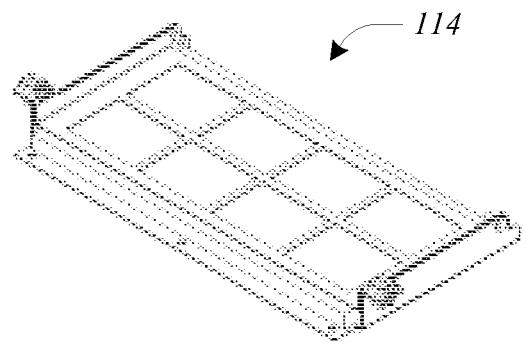
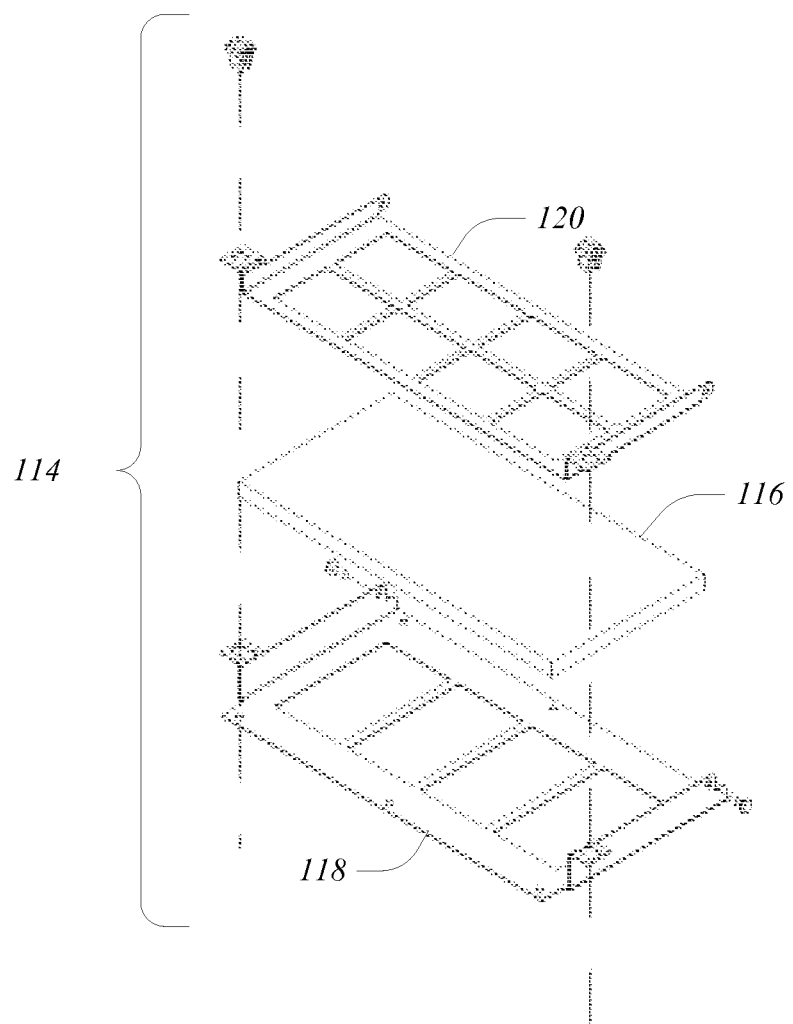
FIG. 17B

ELECTRONIC DISPLAY CABINET

CLAIM OF PRIORITY

This patent application claims the benefit of priority, under 35 U.S.C. Section 119(e), to Peter McMahon et al., U.S. Patent Application Ser. No. 61/970,043, entitled "ELECTRONIC DISPLAY CABINET," filed on Mar. 25, 2014, which is hereby incorporated by reference herein in its entirety.

TECHNICAL FIELD

This document pertains generally, but not by way of limitation, to cabinets for electronic displays employed in outdoor environment where the electronic display is exposed to the weather and the potential for unauthorized access.

BACKGROUND

Electronic displays can be used in outdoor venues such as shopping malls, transportation hubs, sporting arenas and other high traffic outdoor areas. These outdoor electronic displays can be placed within a protective cabinet that can limit unauthorized access to the electronic display and can shield the display from inclement weather or airborne contaminants. As different geographic regions can have substantially different weather and environmental conditions, cabinets for electronic displays can be designed to account for different types of weather conditions and climates. Cabinets can be classified according to the type of weather conditions and climate the cabinet is designed to protect. The classification can also include the level of protection provided by the cabinet.

Certain types of cabinets, such as those having a National Electrical Manufactures Association ("NEMA") Type 3R or a NEMA Type 4X rating, can provide a high level of protection against windblown particulates, the ingress of liquid water, corrosion and damage from ice forming on the exterior of the cabinet. The protection can be provided by placing the display within a water-tight shroud that can protect the display from moisture and other contaminants. While the shroud can limit the moisture and contaminants that can reach the display, the openings in the shroud can provide routes through which moisture and contaminants can penetrate. The openings can receive cabling for the displays, providing ventilation for the displays and receiving mounting features for suspending or otherwise mounting the cabinet on support structures.

A corresponding challenge is that the final mounting position of a cabinet can be varied depending on the end user's needs and available mounting structures. Accordingly, certain cabinets can be provided with a plurality of pre-drilled mounting openings positioned linearly or in an array. One or more of the pre-drilled mounting openings can be aligned with the mounting features to position and mount the cabinet in the desired position. However, the extra, unused mounting openings can provide an additional pathway for moisture or other contaminants that must be sealed or otherwise covered to prevent the moisture or contaminants from entering the cabinet.

One approach that can be employed to avoid the problem of unused mounting openings is to provide the cabinet without any openings and having an installer drill only the minimum number of mounting openings required at the positions corresponding to the appropriate mounting position for the cabinet. While this approach can minimize the number of openings in the cabinet, this arrangement can require the installer to drill the openings at the proper locations with the appropriate bore diameter and shape. If the openings are drilled at incorrect positions, new openings must then be drilled resulting in unnecessary openings in the cabinet compromising the integrity of the cabinet. Similarly, if the opening is improperly drilled or drilled at the wrong size, then the mounting feature may not properly seat within the opening or deform the edges of the opening, allowing moisture to penetrate the cabinet between the mounting feature and the edges of the hole. The installer must also be trusted to properly seal the mounting features within the opening to avoid moisture or contaminant ingress.

OVERVIEW

The present inventors have recognized, among other things that a problem to be solved can include providing a single cabinet that can be variably mounted without requiring pre-drilling of a plurality of mounting openings or installed drilling of mounting openings. The cabinet system and methods described herein, the present subject matter can provide a solution to this problem, such as by providing a cabinet system having a protective shroud and an external frame defining at least one linear track. The protective shroud can define a protected inner space shielded from moisture and airborne contaminants. The cabinet system can also include a mounting assembly having a mounting arm that can be affixed to a support structure and also having a mounting foot slidably engaged to the at least one track. The mounting foot can be fixed at positions along the linear track allowing the cabinet to be mounted at multiple positions relative to the support structure.

In an example, the support frame can comprise one or more rigid struts extending around at least a portion of the protective shroud to support the protective shroud when the support frame is attached to a structure via the mounting assembly. The one or more rigid struts of the support frame can be affixed to the exterior of the protective shroud to structurally support the protective shroud and prevent deformation of the protective shroud. The support frame arrangement can shield the attachment points between the struts and the protective shroud to reduce the likelihood that moisture or contaminants will enter the inner space through the protective shroud via the attachment points. In at least one example, the cabinet system can include an outer shroud positioned over the rigid struts to further shield the inner space from moisture and airborne contaminants.

In an example, the support frame can comprise a first plurality of rigid struts and a second plurality of rigid struts. The first plurality of rigid struts and the second plurality rigid struts can be arranged in parallel to define a raceway between the struts of the first plurality of struts and the struts of the second plurality of struts. The raceway can extend at least around a portion of the protective short and can operate to guide cabling around the periphery of the protective shroud to one or more desired points from which the cabling can be directed into the protective shroud. Thus, the cabling can be routed to an entry location on the protective shroud that can be less likely to be exposed to moisture or contaminants, such as the lower sides of the protective shroud. In an example, the foot can include an internal cable channel through which the cabling can be passed to directly enter the raceway through an opening in the outer shroud to conceal the cabling. In this configuration, the foot can include a covering plate that obscures the opening for the cabling from moisture and other contaminants.

In an example, the protective shroud can comprise at least one cabling port providing access through the protective shroud into the inner space. The cabling port can include an elastomer stopper positioned within the cabling port that can seal against the cabling port. The elastomer stopper can define at least one conduit for receiving at least one cable. The conduit can be sized to seal against the cable received within the conduit to minimize any gap through which moisture or contaminants can penetrate around the cable to enter the inner space.

In an example, the cabinet system can also include an outer shroud having at least one slot aligned with each linear track of the protective shroud. The outer shroud can limit exposure of the protective shroud, support frame and cabling within the raceway to moisture and contaminants. In this configuration, the outer shroud can cooperate with the one or more struts and the protective shroud to guide cabling along the raceway. The protection provided by the outer shroud can limit the moisture or contaminants that can reach the protective shroud, reducing the moisture or contaminants that can penetrate the protective shroud. The outer shroud can also protect the external frame from direct exposure to the weather, preventing or slowing corrosion of the external frame that can compromise the integrity of the inner shroud. The outer shroud can be fixedly mounted to the protective shroud and the mounting element can be engaged with the track through the at least one shroud to permit axial movement of the cabinet.

In an example, the window frames can include a releasable locking element for releasably securing each window frame to the protective shroud. The locking element can include a recessed mounting element having a bore hole for receiving a locking fastener. In this configuration, the lip of the protective shroud can include a corresponding bore hole for receiving the locking fastener to secure the window frame to the protective shroud. The recessed configuration of the mounting element can reduced the likelihood of moisture reaching the bore hole of the mounting element and penetrating the between the window frame and the protective shroud. In an example, the window frame can also include an access port through which the locking fastener is inserted to access the recessed mounting element. In certain examples, the access port can be sized to further shield the recessed mounting element from additional exposure from moisture and environmental conditions. In an example, the protective shroud can include a secondary locking feature that can further engage the locking fastener to prevent slippage of the locking fastener due to temperature changes and other environmental conditions creating gaps between the window frame and the protective shroud.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 11A is a front perspective view of a baffle assembly according to an example of the present disclosure.

FIG. 11B is a rear perspective view of the baffle assembly depicted in FIG. 11A.

FIG. 11C is a front exploded perspective view of the baffle assembly depicted in FIG. 11A.

FIG. 11D is a rear exploded perspective view of the baffle assembly depicted in FIG. 11A.

FIG. 11E is an exploded view of the baffle assembly depicted in FIG. 11A.

FIG. 17A is a perspective view of a filter assembly according to an example of the present disclosure.

FIG. 17B is an exploded view of the filter assembly depicted in FIG. 17A.

DETAILED DESCRIPTION

Figure 1:
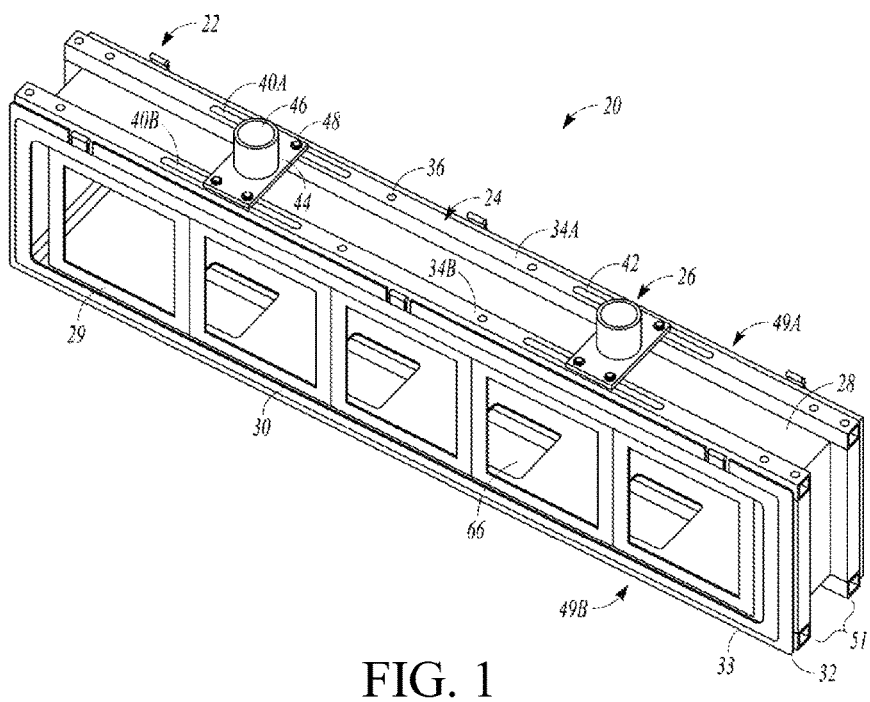
FIG. 1 is a perspective view of a cabinet system according to an example of the present disclosure.
Figure 2:
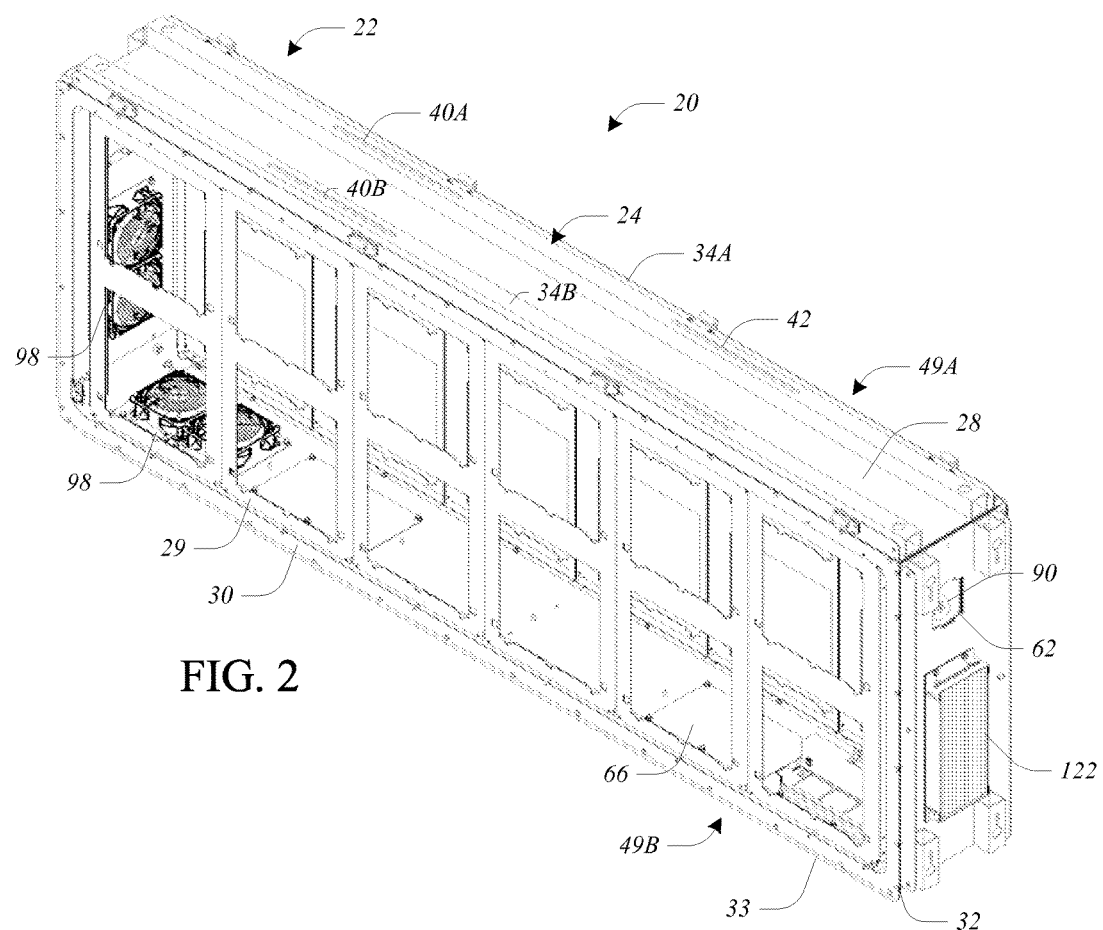
FIG. 2 is a perspective view of a cabinet system according to an example of the present disclosure.
Figure 3:
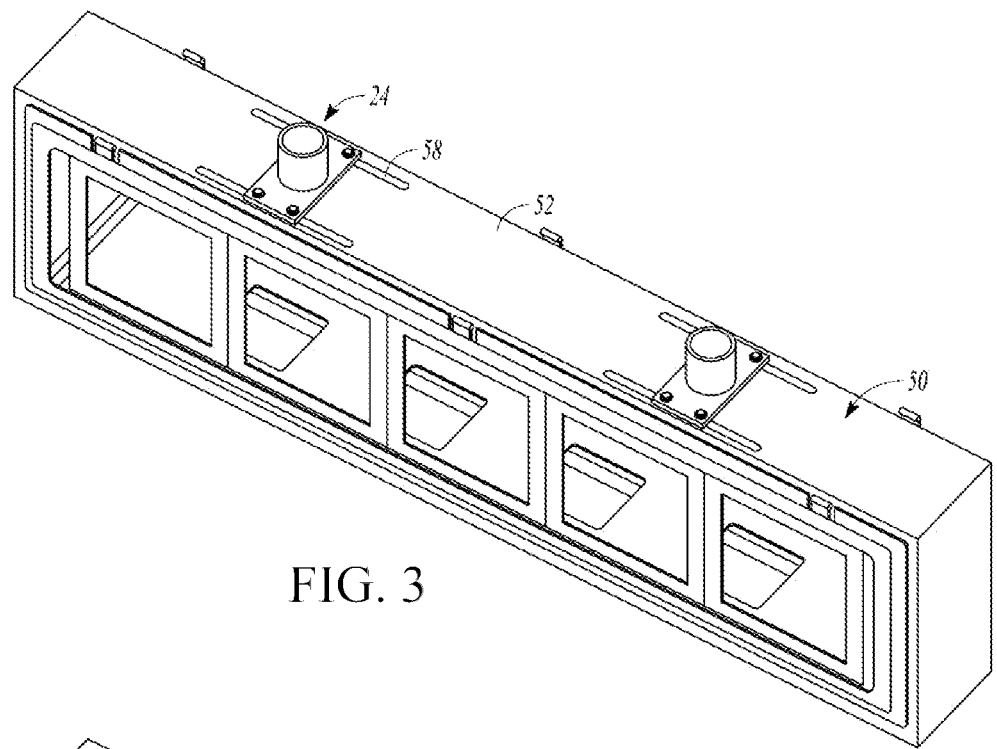
FIG. 3 is a perspective view of a cabinet system according to an example of the present disclosure.

As depicted in FIGS. 1-4, a cabinet system 20, according to an example of the present subject matter, can comprise a protective shroud 22 having a support frame 24 and at least one mounting assembly 26. The protective shroud 22 can include a frame 28 and at least one window frame 30 for receiving a transparent window 32. The window frame 30 can be affixed to a rectangular frame 28 to define an internal space for receiving at least one electronic display. As depicted in FIG. 3, in at least one example, a transparent window can be mounted to the rectangular frame 28 to allow viewing of the electronic display while preventing contaminants from entering the inner space protected by the protective shroud 22. As depicted in FIG. 5, in at least one example, a cover 106 can be affixed to the wind frame 30 to prevent viewing into the protected space. In an example, the rectangular frame 28 can comprise a generally rectilinear-shaped frame, as electronic displays typically have a rectangular shape. For this reason, the rectangular frame 28 will be referred to herein as a rectangular frame 28. However, it is contemplated that other shaped frames can be used.

The cabinet system 20 can enclose an electronic display that can provide for the display of visual information, e.g., textual information, photos, or video information. The electronic display can include an array of a plurality of light-emitting elements that can be configured and controlled to display the visual information, as is known in the art. The electronic display can comprise, but is not limited to light-emitting diodes (LEDs) displays, organic light-emitting diodes (OLEDs) displays, organic light-emitting transistors (OLETs) displays, surface-conduction electron-emitter display devices (SEDs), field-emission display devices (FEDs), laser TV quantum dot liquid crystal display devices, quantum dot display devices (QD-LED), ferro-liquid display devices (FLDs), liquid crystal display devices (LCDs), and thick-film dielectric electroluminescent devices (TDELs). Examples of electronic displays that can be used with the cabinet system 20 of the present disclosure can include, but are not limited to, electronic display modules sold under the AF-6xxx Series trademark by DAKTRONICS, INC., Brookings, S. Dak., USA, the disclosures of which are incorporated herein by reference. In an example, the rectangular frame 28 can include at least one display mount 29 for receiving and positioning the display such that the display is visible through the window frame 30. In certain examples, the frame 28 can include mirrored display mounts 29 positioned in parallel for positioning displays in opposite directions for viewing of the displays from at least two opposing directions.

The rectangular frame 28 can include a lip 32 for securing the window frame 30 to the rectangular frame 28. In an example, the window frame 30 can be secured to a corresponding lip 32 using one or more fasteners 33 to secure the window frame 30 to the lip 32. The fasteners 33 can comprise, for example, screws, brads, staples, welds, pins, bolts, and the like. The window frame 30 can also be secured to the rectangular frame 28 with adhesive in place of, or in addition to, fasteners. In certain examples, the interface between the lip 32 and the window frame 30 can be sealed, such as with a gasket or other sealing device, to prevent moisture or contaminants from penetrating between the rectangular frame 28 and the window frame 30. As depicted in FIG. 1, in certain examples, the protective shroud 22 can include at least two window frames 30 positioned on opposing sides of the rectangular frame 28.

Figure 13A:
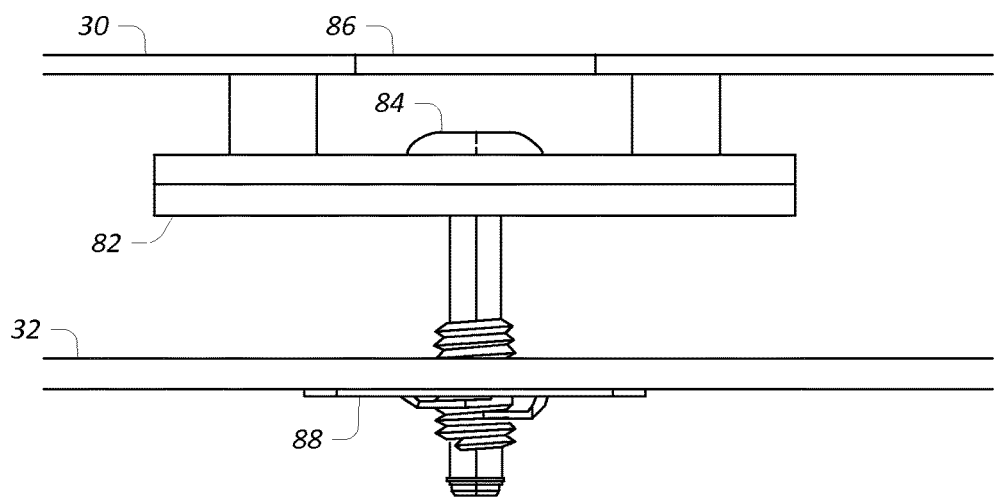
FIG. 13A is a side cross-sectional view of a portion of cabinet system according to an example of the present disclosure.
Figure 13B:
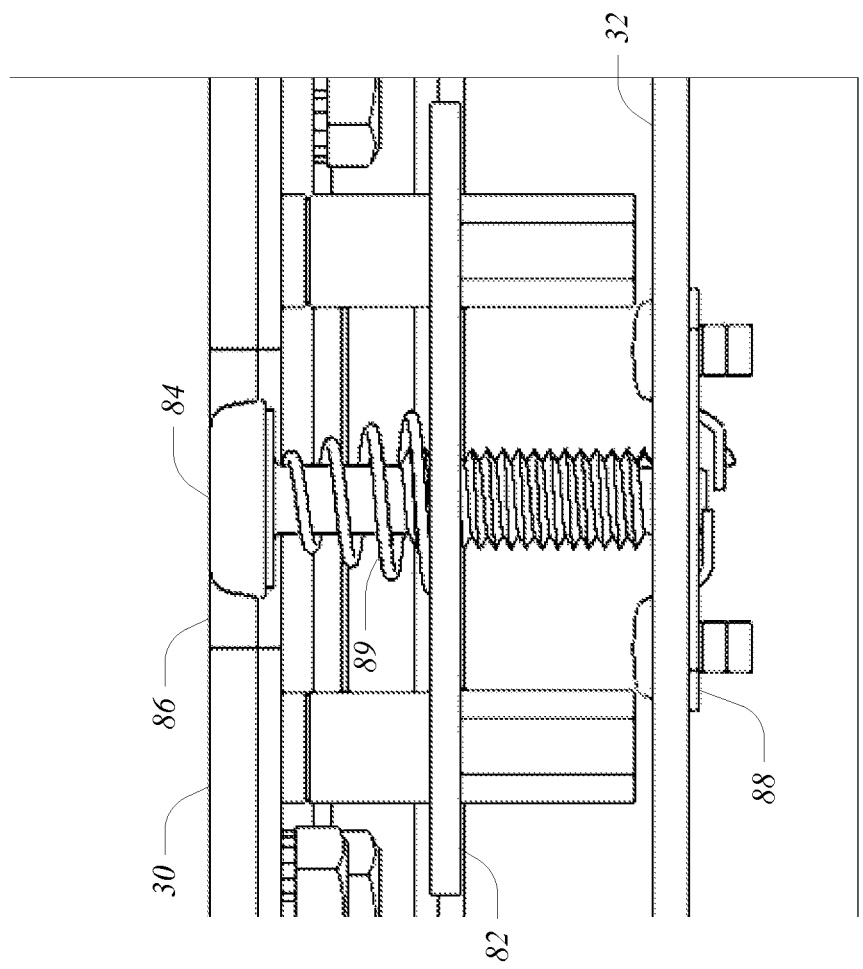
FIG. 13B is a side cross-sectional view of a portion of cabinet system having a bias spring according to an example of the present disclosure.

As depicted in FIG. 13A, in an example, the window frames 28, 30 can include a releasable locking element 80 for releasably securing each window frame 28, 30 to the protective shroud 22. The locking element 80 can include a recessed mounting element 82 having a bore hole for receiving a locking fastener 84. In this configuration, the lip 32 of the protective shroud 22 can include a corresponding bore hole for receiving the locking fastener 84 to secure the window frame 28, 30 to the protective shroud 22. In an example, the window frame 28, 30 can include an access port 86 through which the locking fastener 84 is inserted to access the recessed mounting element 82. The recessed configuration of the mounting element 82 conceals the locking fastener 84 of the mounting element 82. The mounting element 82 also reduces the likelihood that moisture and contaminates will penetrate the between the window frame 28, 30 and the protective shroud 22 through the access port 86. In certain examples, the access port 86 can be sized to further shield the recessed mounting element 84 from additional exposure from moisture and environmental conditions. In an example, the protective shroud 22 can include a secondary locking feature 88 that further engages the locking fastener 84 to prevent slippage of the locking fastener 84 due to temperature changes and other environmental conditions creating gaps between the window frame 28, 30 and the protective shroud 22. As depicted in FIG. 13B, in an example, the releasable locking element 80 can further comprise a bias spring 89 that engages the fastener 84 against the secondary locking feature 88 to further secure the fastener 84.

The support frame 24 can include a plurality of rigid struts 34a, 34b (collectively referred to herein as "rigid struts 34" or "rigid strut 34"). In an example, the rigid struts 34a, 34b can be arranged end-to-end to define the shape of the rectangular frame 28, e.g., by defining a rectangular shape positioned around the example rectangular frame 28 of the protective shroud 22 as shown in FIG. 1. As depicted in FIG. 2, in at least one example, the rigid struts 34a, 34b can have shortened struts that do not extend entirely around the protective shroud 22, but generally define a rectangular shape. The rigid struts 34 can comprise a tubular structure for receiving at least one fastener 36 extending through the center of the rigid strut 34 into the rectangular frame 28 of the protective shroud 22 to secure the rigid strut 34 to the rectangular frame 28. The body of each strut 34 can shield the fastener 36 to prevent moisture and contaminants from entering the protective shroud 22 around the fastener 36. As depicted in FIG. 1, the plurality of rigid struts 34 can include at least one track strut 40s, 40b (collectively referred to herein as "track strut 40" or "track struts 40") comprising at least one elongated track 42.

As depicted in FIGS. 1-3 and 7, each mounting assembly 26 can include a foot 44 and a mounting arm 46. The mounting arm 46 can be secured to a support structure including, but not limited to ceilings, walls and building frames. The foot 44 can be configured to receive at least one fastener 48 in order to secure the mounting assembly 26 to the rectangular frame 28, such as by securing the foot 44 to the track strut 40. Each fastener 48 can slide within the elongated track 42 to allow shifting of the protective shroud 22 relative to the mounting assembly 26. The at least one fastener 38 can then be tightened or otherwise secured to the track 42 to fix the relative position of the protective shroud 22 and the mounting assembly 26 when a desired positioning is achieved.

Figure 14:
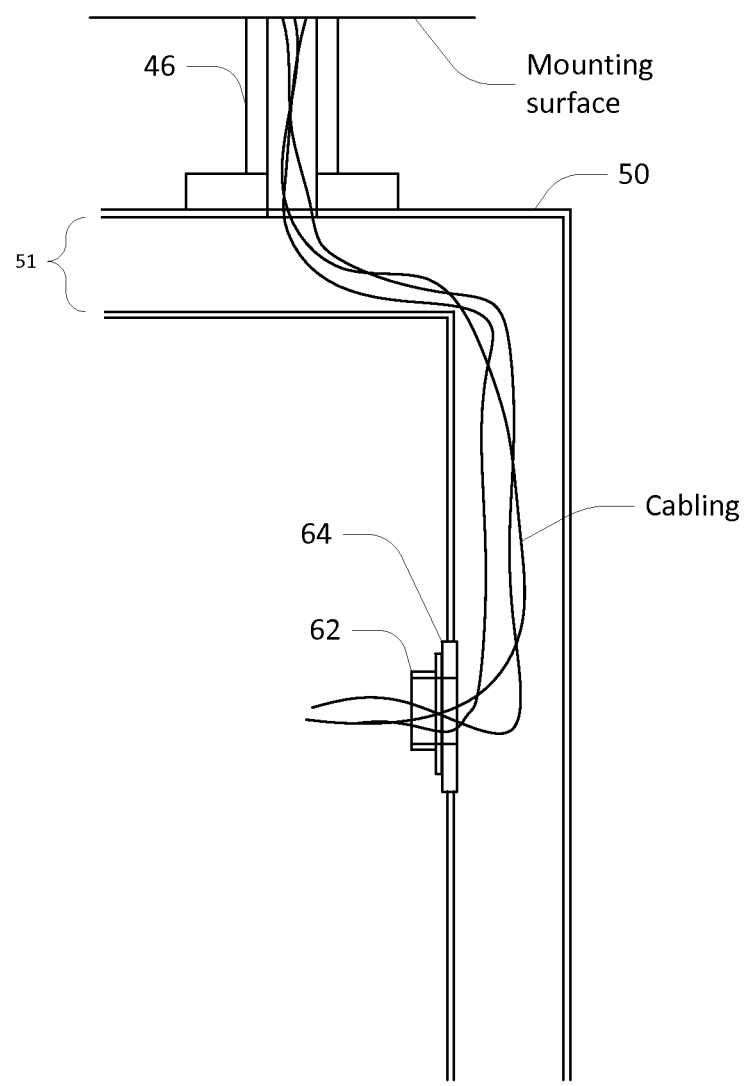
FIG. 14 is a front cross-sectional view of a portion of cabinet system according to an example of the present disclosure.
Figure 15:
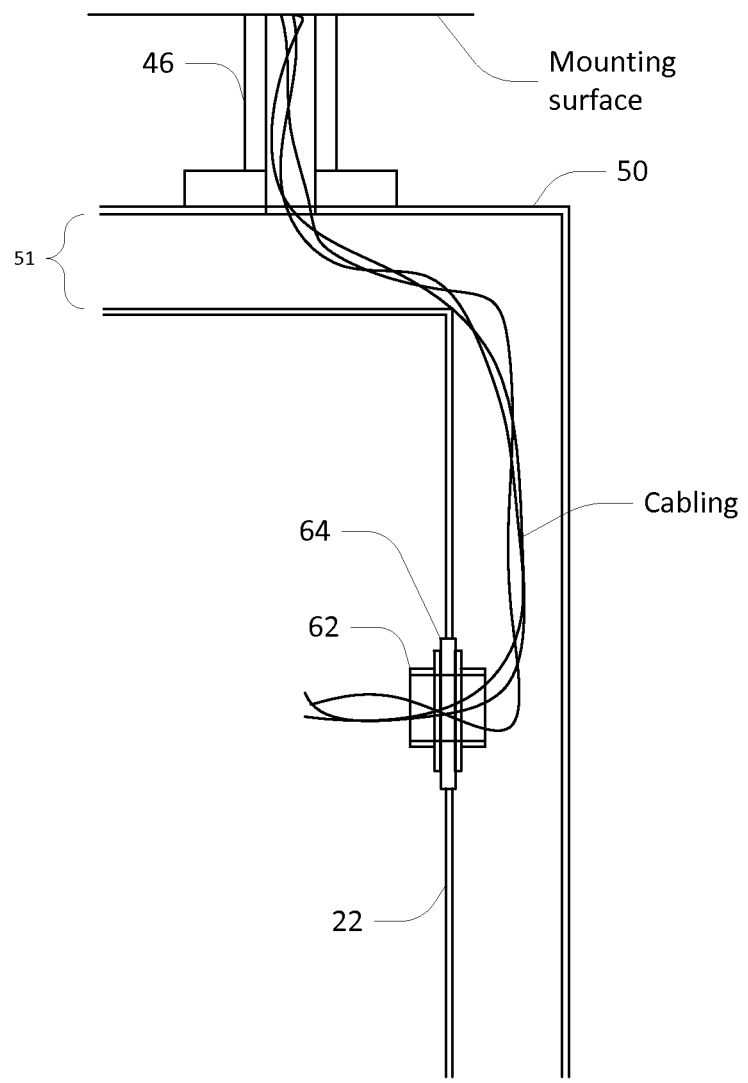
FIG. 15 is a front cross-sectional view of a portion of cabinet system according to an example of the present disclosure.

The support frame 24 can include a first plurality of rigid struts 34a and a second plurality of rigid struts 34b. The first plurality of rigid struts 34a can be positioned on a first side 49a of the cabinet system 20 and the second plurality of rigid struts 34b can be positioned on an opposing second side 49b of the cabinet system 20. The first plurality of rigid struts 34a and the second plurality of rigid struts 34b can be arranged around the rectangular frame 28 in parallel to define a raceway 51 between the rigid struts 34a, 34b. The raceway 51 can receive and guide the cabling around an exterior of the protective shroud 22. As depicted in FIGS. 14-15, in an example, the mounting arm 46 can define a cable channel 47 through which cabling can be pass through and directly enter the raceway 51 without exposing the cabling and the raceway 51 to exterior conditions. The first plurality of rigid struts 34a can include at least one first track strut 40a comprising at least one first elongated track 42a. The second plurality of rigid struts 34b can include at least one second track strut 40b comprising at least one second elongated track 42b. In this configuration, each foot 44 can span between the sides 49a, 49b of the cabinet system 20 and can be configured to engage each rigid strut 34a, 34b, such as by receiving the at least one fastener 48 for engaging each track strut 40a, 40b to prevent torquing of the protective shroud 22 relative to the mounting arm 46.

Figure 4:
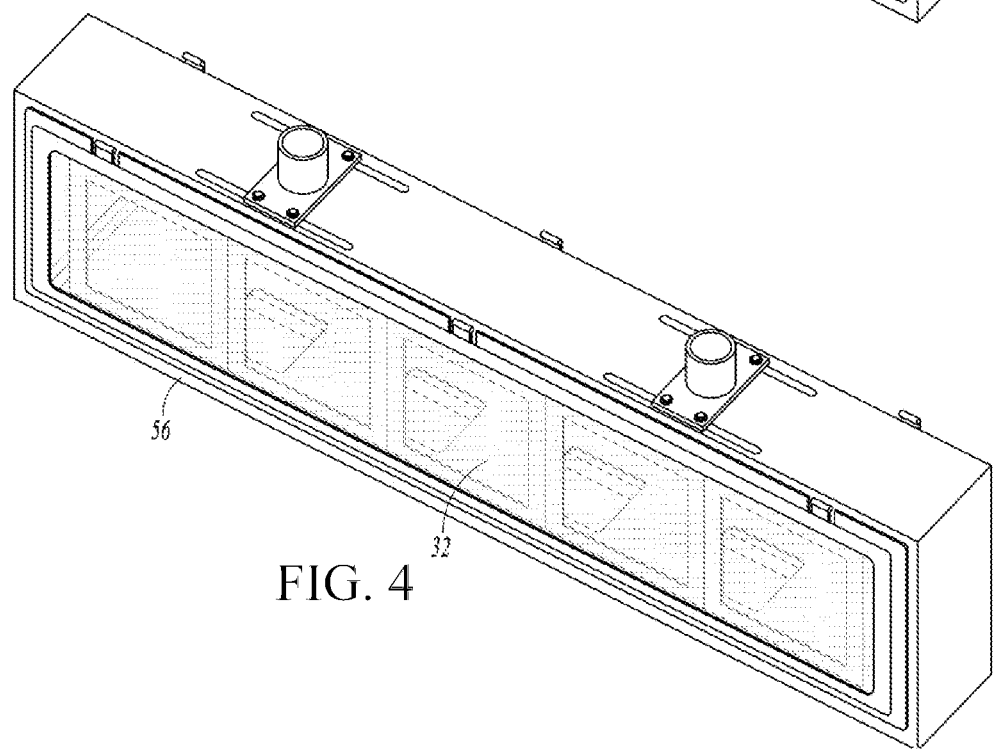
FIG. 4 is a perspective view of a cabinet system with a transparent cover according to an example of the present disclosure.
Figure 5:
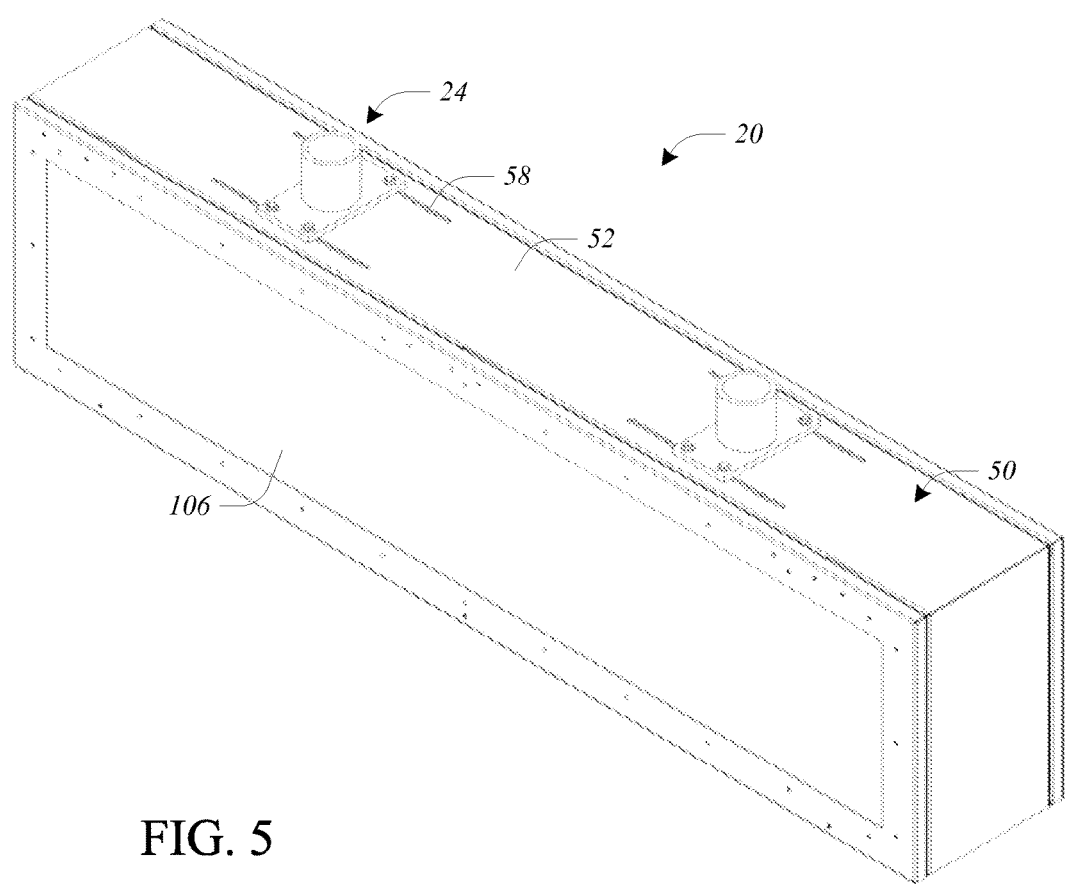
FIG. 5 is a perspective view of a cabinet system with a cover according to an example of the present disclosure.
Figure 12:
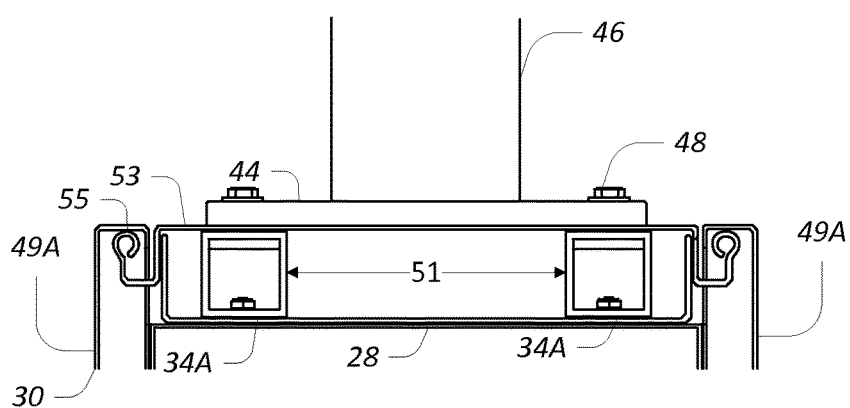
FIG. 12 is a side cross-sectional view of a portion of cabinet system according to an example of the present disclosure.

As depicted in FIGS. 3-4, in an example, the cabinet system 20 can include an outer shroud 50 sized to receive the protective shroud 22 and the support frame 24 or to the inner protective shroud 22. The outer shroud 50 can be configured to receive at least one fastener 51 to secure the outer shroud 50 to the external frame 24. The outer shroud 50 can comprise a shape that corresponds to the shape of the protective shroud 22 and the support frame 24. For example, in order to correspond to the example rectangular shroud 22 and the example rectangular frame 24, the outer shroud 50 can include a rectangular frame 52. The outer shroud 50 can also include at least one window frame 54 for mounting a window 56 to the rectangular frame 52. The outer shroud 50 can comprise at least two window frames 54 positioned to align with the windows 32 of the protective shroud 22. The outer shroud 50 can also comprise at least one slot 58 positioned to align with the elongated track 42 in the rigid struts 34 of the support frame 24. In this configuration, each fastener 48 of the foot 44 can extend through the slot 58 of the outer shroud 50 to secure the foot 44 to the track 42 of the support frame 24 so that the outer shroud 50 can be secured to the inner protective shroud 22. As depicted in FIG. 12, in an example, the outer shroud 50 can include removable top cover 53 that interlocks with the window frames 30 to facilitate easier access to the raceway 51. In at least one example, the outer shroud 50 can include a cable port through which cabling can be fed into the raceway 51. The cable port can be aligned to receive cabling from the cable channel 47. In certain example, the top cover 53 can comprise a lip portion 55 that interfaces with the window frame 54 to prevent moisture from penetrating the raceway 51 between the top cover 53 and the window frame 30.

The mounting assembly 26 further can comprise a mounting plate 60 positionable between the protective shroud 22 and the outer shroud 50. The mounting plate 60 can be configured to receive each fastener 48 such that mounting plate 60 operates to slidably retain the foot 40 against the outer shroud 50.

As depicted in FIGS. 14-15, in an example, the inner protective shroud 22 can further comprise at least one cabling port 62. In at least one example, each cabling port 62 can include an elastomer stopper 62 defining at least one cabling conduit 64 for receiving a cable. In certain examples, the elastomer stopper 62 can be sized to seal against the edges of the cabling port 62 to prevent moisture and contaminants from passing between the elastomer stopper 62 and the edges of the cabling port 62. The cabling conduit 64 can be sized to seal against cabling positioned within the cabling conduit 64 to prevent leakage of moisture or contaminants through the cabling conduit 64.

Figure 16:
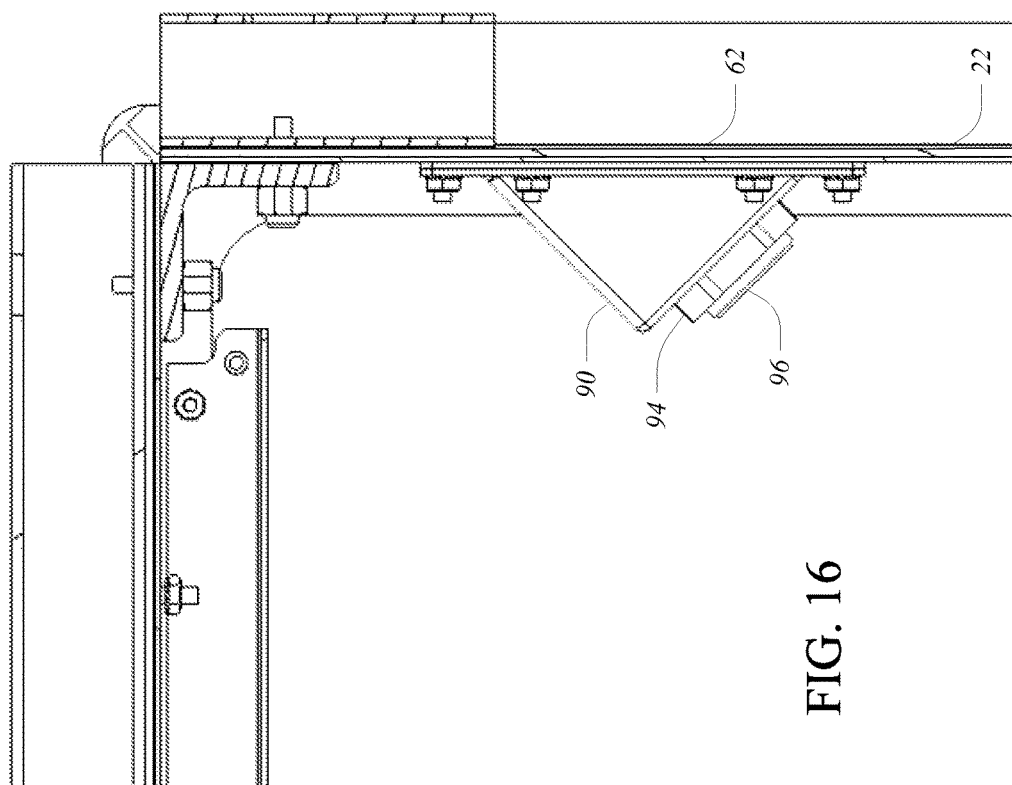
FIG. 16 is a front cross-sectional view of a portion of cabinet system according to an example of the present disclosure.

As depicted in FIGS. 2 and 15-16, in at least one example, the protective shroud 22 can further comprise a cable box 90 that can be engaged to the cabling port 62. The cable box 90 includes a housing 92 and a secondary cable port 94 for receiving cabling from the raceway into the protected space. The housing 92 is angled inward into the protected space to angle the secondary cable port 94 relative to the exterior of the protective shroud 22. The angling of the secondary cable port 94 reduces stress on cabling entering the secondary cable port 94 by bending the cabling less than 90 degree to pass the cabling through the protective shroud 22. In an example, an elastomer stopper 96 can be positioned in the secondary cable port 94 to seal against the cabling.

As depicted in FIGS. 1-4, in an example, the inner protective shroud 22 can further comprise at least one access opening 66. Each access opening 66 can be positioned on the underside of the inner shroud 22 to minimize the likelihood that moisture or contaminants from penetrating the protected space of the inner shroud 22. In an example, an access door (not shown) can be positioned within the access opening 66 to limit access the protected space. The access door can be configured to provide a seal against the access opening 66 preventing or minimizing penetration by moisture or contaminants through the access openings 66.

Figure 6:
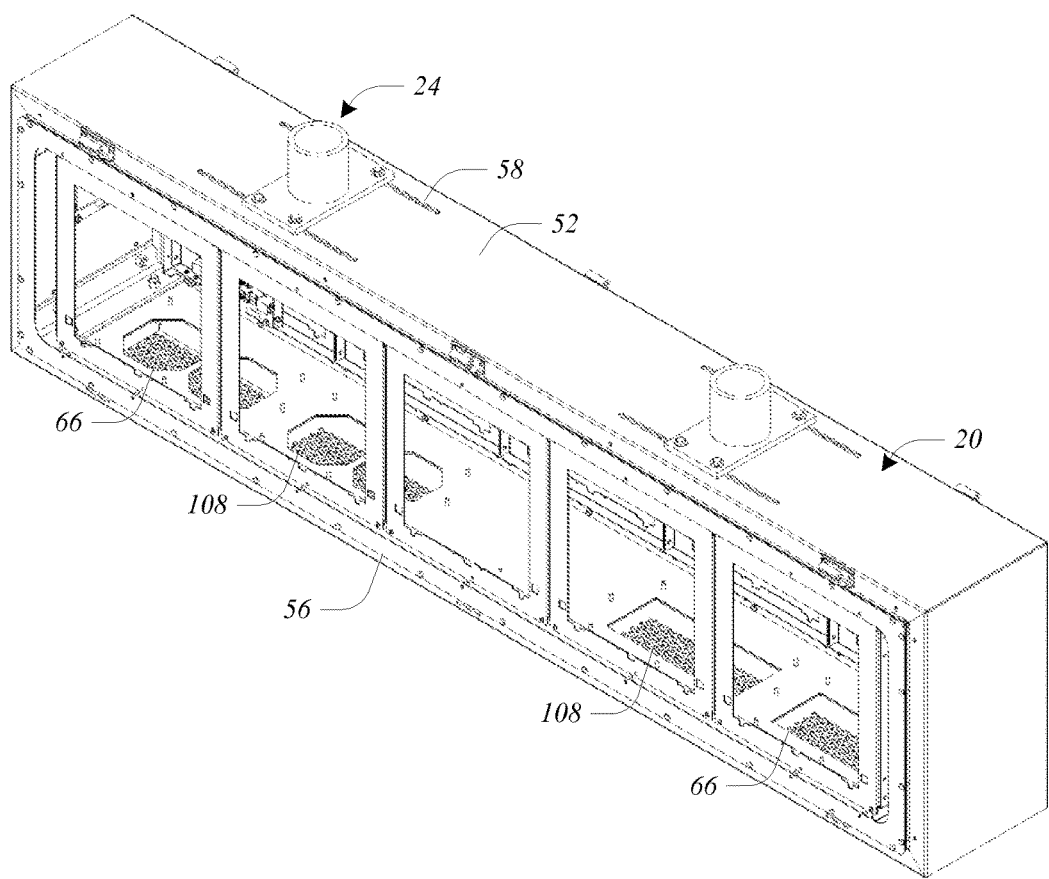
FIG. 6 is a perspective view of a cabinet system according to an example of the present disclosure.
Figure 7:
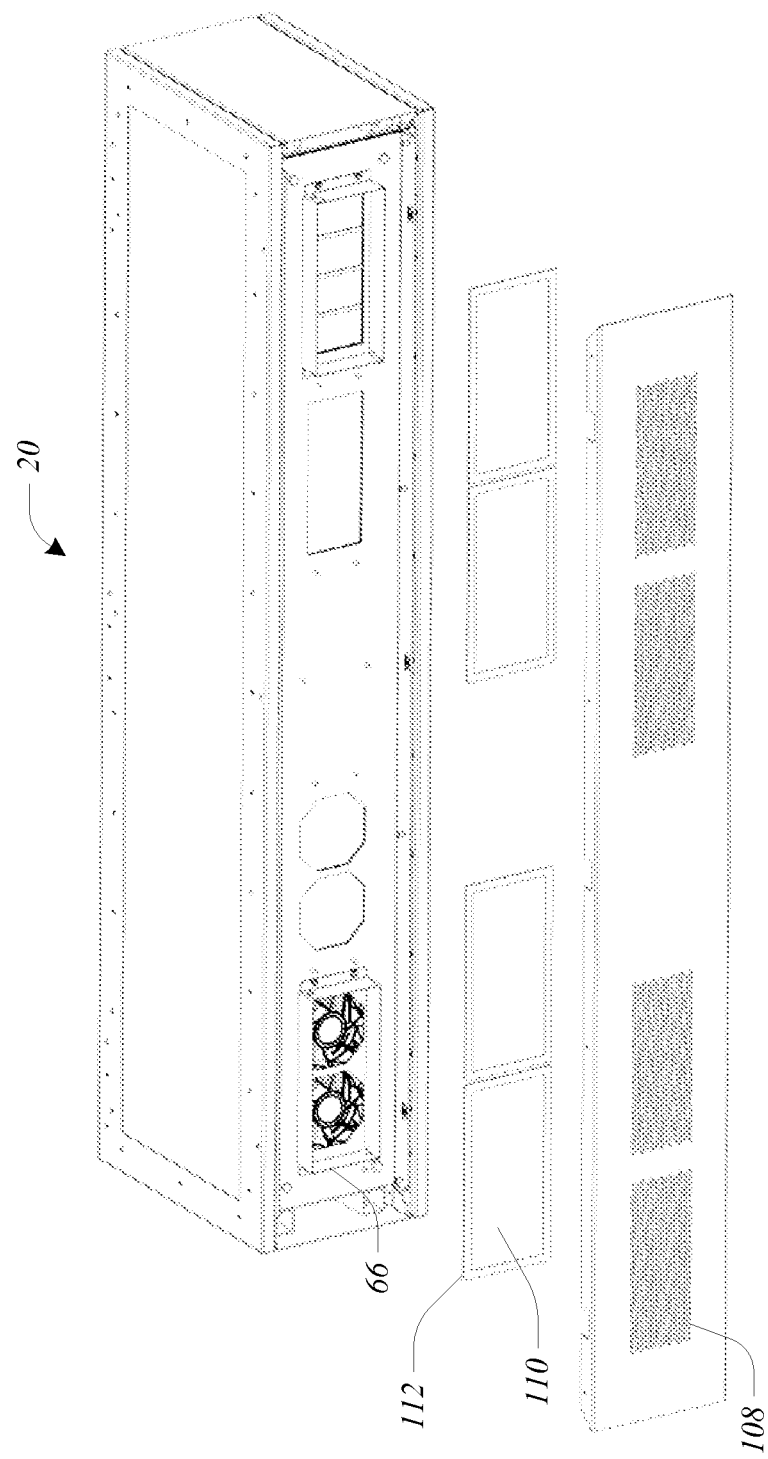
FIG. 7 is a partial exploded, underside view of a cabinet system according to an example of the present disclosure.

As depicted in FIGS. 2 and 6-7, in an example, the access opening 66 of the inner shroud 22 can comprise a plurality of shapes and sizes. In at least one example, the underside of the outer shroud 50 can include at least one ventilation opening 108 positioned adjacent each access opening 66. The positioning of the ventilation openings 108 allows air circulation into the inner shroud 22 through the access opening 66 while reducing moisture or contaminants from entering the inner shroud 22.

As depicted in FIG. 7, in an example, a filter 110 can be affixed to the inner shroud 22 adjacent the access opening 66. The filter 110 can prevent contaminates from entering the protected space of the inner shroud 22. In at least one example, the filter 110 can include an adhesive border 112 for securing the filter 110 to the inner shroud 22 or the outer shroud 50 adjacent the access opening 66. As depicted, filter 110 can comprise a filter having a plurality of small openings for permitting air flow while trapping contaminants. In at least one example, the filter 110 can comprise a screen, mesh or other filtering material for permitting air flow, while capturing contaminants.

As depicted in FIGS. 17A-17B, in an example, a filter assembly 114 having a replaceable filter 116 can be positioned adjacent the access opening 66 to prevent contaminates from entering the inner shroud 22. The filter assembly 114 can include a mount portion 118 and a locking mesh 120. The locking mesh 120 can be configured to receive at least one fastener to secure the locking mesh 120 to the mount portion 118 to secure the filter 116. The mount portion 118 is configured to receive at least one fastener to secure the filter assembly 114 to the inner shroud 22 or the outer shroud 50.

Figure 8:
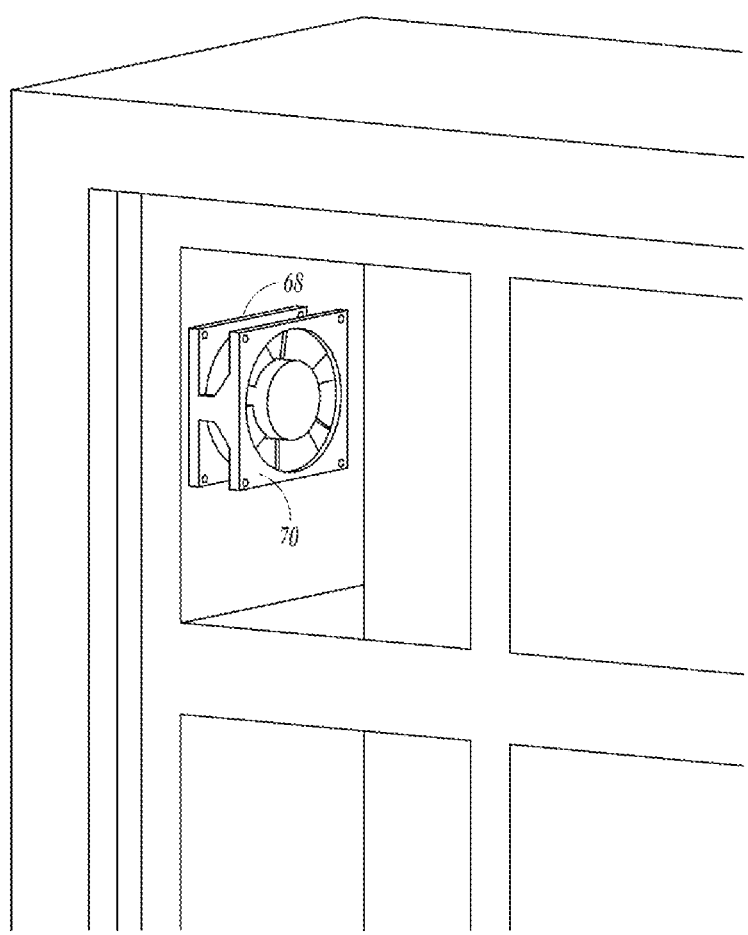
FIG. 8 is a perspective view of an interior portion of a cabinet system according to an example of the present disclosure.
Figure 9:
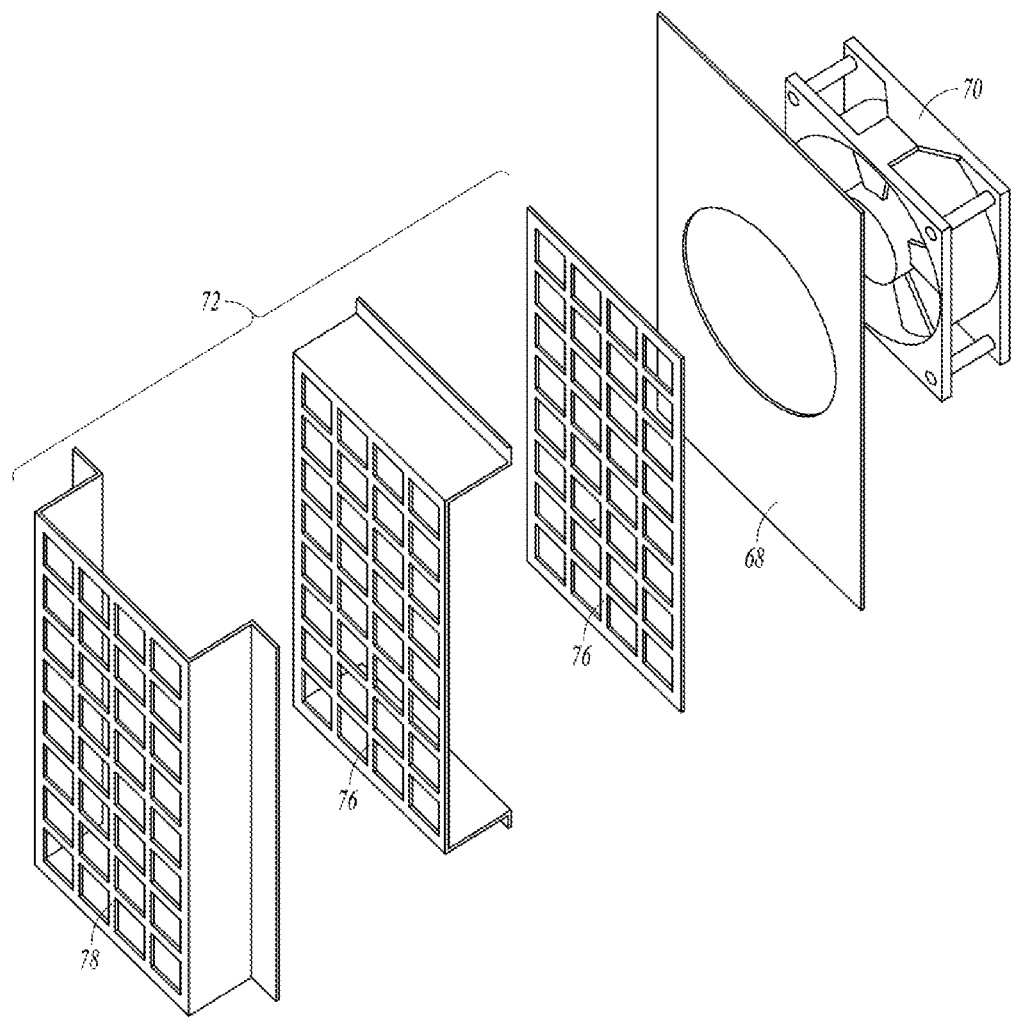
FIG. 9 is an exploded perspective view of a fan assembly according to an example of the present disclosure.
Figure 10:
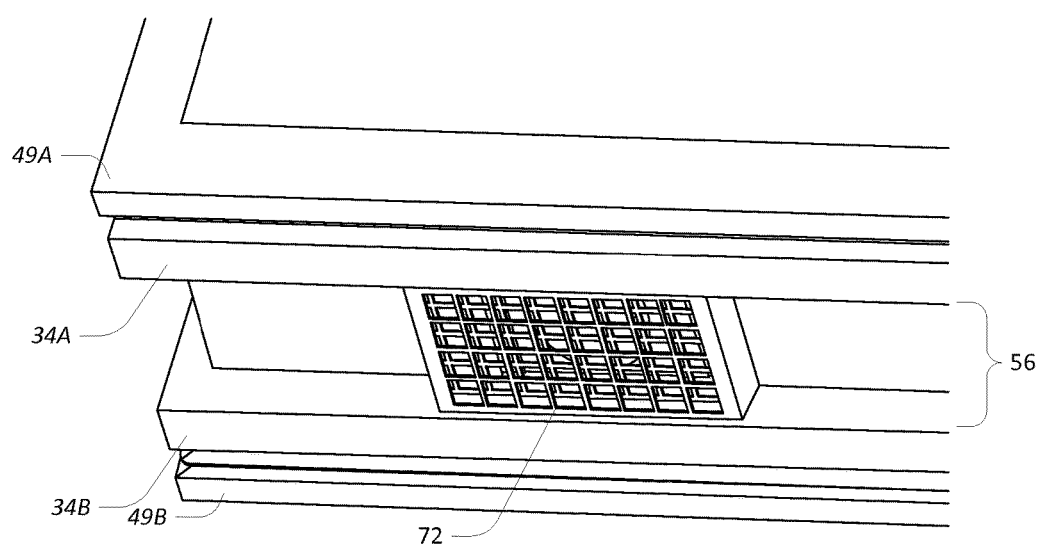
FIG. 10 is a perspective view of an exterior portion of a protective shroud according to an example of the present disclosure.

As depicted in FIGS. 8-10, in an example, the inner shroud 22 can further comprise at least one ventilation opening 68. Each ventilation opening 68 can be positioned on the sides of the inner shroud 22 to minimize the likelihood that moisture or contaminants from penetrating the protected space of the inner shroud 22. A fan 70 can be mounted in the ventilation opening 68 to draw air through the ventilation opening 68 into the protected space. A filter can be positioned within the ventilation opening 68 to prevent moisture or contaminants from being pulled into the protected space through the ventilation opening 68. The fan 70 can also be sealed against the ventilation opening 68 so that penetration of moisture or contaminants around the fan 70 can be prevented or minimized.

Figure 18B:
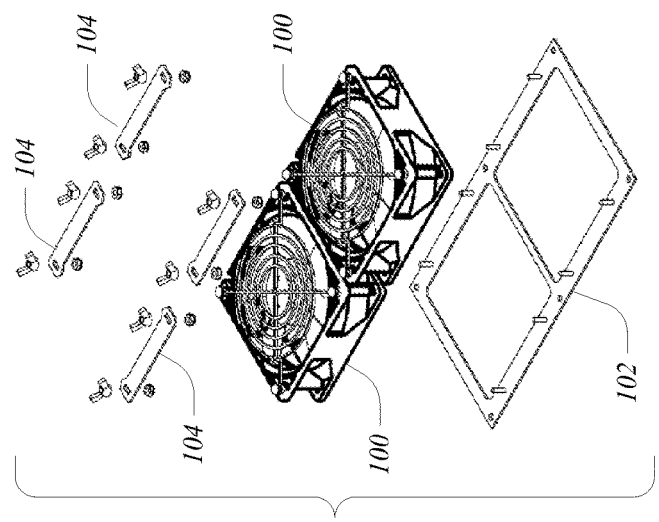
FIG. 18B is an exploded perspective view of a multi-fan assembly depicted in FIG. 18A.
Figure 18A:
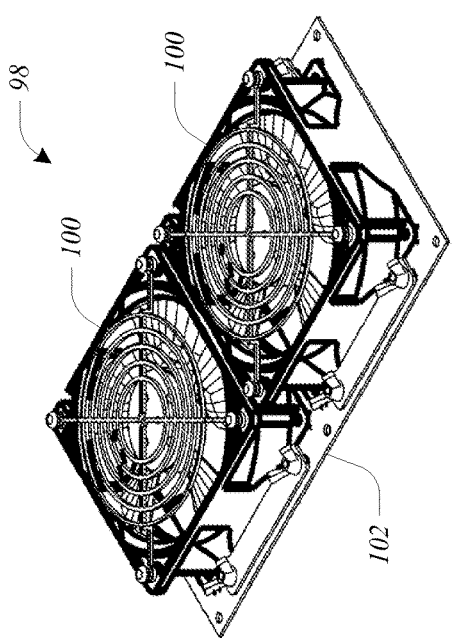
FIG. 18A is a perspective view of a multi-fan assembly according to an example of the present disclosure.

As depicted in FIGS. 2 and 18A-B, in an example, a multi-fan assembly 98 can be mounted in the ventilation opening 68. In this configuration, the multi-fan assembly 98 can include at least two fans 100, a fan frame 102 and at least one locking element 104 corresponding to each fan 100. The locking element 104 can be configured to receive at least one fastener to secure the corresponding locking element 104 to the fan frame 102. The locking element 104 can retain the corresponding fan 100 to the fan frame 102. As depicted in FIG. 2, in at least one example, the multi-fan assembly 98 can be mounted in the access opening 66.

As depicted in FIGS. 9-10, in an example, the fan 70 can include a fan guard assembly 72 positioned over the ventilation opening 68 opposite the fan 70. The fan guard assembly 72 can prevent cabling in the raceway 51 from entering the ventilation opening 68 and fouling the fan 70. The fan guard assembly 72 can include a protective screen 76 having a plurality of interlaced struts to define a plurality of opening allowing air to pass through the screen 76 and entering the ventilation opening while preventing obstructions from passing through the ventilation opening 68. As depicted in FIG. 9, in an example, the fan guard assembly 72 can include a plurality of protective screens 76 and at least one outer screen 78 that cooperate to limit the entry of obstructions from passing through the ventilation opening.

As depicted in FIGS. 11A-11B, in an example, a baffle assembly 122 mounted over the ventilation opening 68 opposite the fan 70. The baffle assembly 122 can comprise a baffle frame 124 and a plurality of baffles 126. The baffle frame 124 can be mounted to the inner shroud 22 to position the baffles 126 over the ventilation opening 68. The baffle frame 124 can comprise a plurality of angled slots for receiving a corresponding baffle 126 to angle the baffles 126 over the ventilation opening 68. The angled baffles 126 permit air to flow through the ventilation opening 68 while obscuring the ventilation opening 68 to reduce the likelihood that contaminants from entering the inner shroud 22. In an example, the baffle assembly 122 can include a mounting frame 128 and a locking frame 130 configured to receive a fastener to secure the mounting frame 128 to the locking frame 130 and retain the baffle frame 124 and the baffles 126. In at least one example, an elastomer liner 129 can be affixed to the mounting frame to seal the baffle assembly 122 to the inner shroud 22.

Each of these non-limiting examples can stand on its own, or can be combined in any permutation or combination with any one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A cabinet system, comprising:
 a protective shroud defining a protected space and at least one opening for viewing into the protective shroud;
 an external frame including a first plurality of rigid struts and a second plurality of rigid struts extending around the protective shroud, wherein at least one of the first plurality of rigid struts defines a first elongated track, wherein the second plurality of rigid struts are arranged parallel to the first plurality of rigid struts to define a raceway therebetween; and
 at least one mounting arm securable to a support structure and including a mounting foot, wherein the mounting foot is configured to receive a first fastener insertable into the first elongated track of the first plurality of rigid struts to slidably connect the external frame to the mounting arm.

2. The cabinet system of claim 1, wherein the mounting arm defines an internal conduit for guiding cabling into the raceway between the first and second pluralities of rigid struts.

3. The cabinet system of claim 1, wherein at least one of the second plurality of rigid struts defines a second elongated track parallel to the first elongated track;
 wherein the mounting foot is configured to receive a second fastener insertable into the second elongated track of the second plurality of rigid struts.

4. The cabinet system of claim 1, wherein the protective shroud further includes at least one cabling port for receiving cabling from the raceway into the protected space.

5. The cabinet system of claim 4, wherein the protective shroud further includes an elastomer stopper positioned within the cabling port and defining a conduit for receiving cabling from the raceway into the protected space.

6. The cabinet system of claim 1, wherein the cabinet system further includes:
an outer shroud sized to receive the external frame and protective shroud, wherein the outer shroud defines a slot aligning with the first elongated slot permitting the mounting arm to slidably connect to the outer frame through the outer shroud.

7. The cabinet system of claim 1, wherein the cabinet system further includes:
at least one window frame engagable to the protective shroud to retain at least one window pane over the opening of the protective shroud;
wherein the protective shroud includes at least one lip securable to the window frame.

8. The cabinet system of claim 7, wherein the window frame further includes a recessed mounting element for receiving at least one fastener;
wherein the fastener is insertable into a corresponding borehole on the lip of the protective shroud to secure the window frame to the protective shroud.

9. The cabinet system of claim 8, wherein the lip of the protective shroud further includes a secondary locking feature that engages the fastener to movement of the fastener due to changing environmental conditions.

10. The cabinet system of claim 8, wherein the window frame further includes an access port positioned over the recessed mounting element for receiving and accessing the fastener.

11. A cabinet system, comprising:
a protective shroud defining a protected space, at least one opening for viewing into the protective shroud, and a ventilation opening, wherein the protective shroud further includes a fan guard assembly positioned over the ventilation opening to prevent cabling from entering through the ventilation opening;
an external frame including a first plurality of rigid struts extending around the protective shroud, wherein at least one of the first plurality of rigid struts defines a first elongated track; and
at least one mounting arm securable to a support structure and including a mounting foot, wherein the mounting foot is configured to receive a first fastener insertable into the first elongated track of the first plurality of rigid struts to slidably connect the external frame to the mounting arm.

12. The cabinet system of claim 11, wherein the protective shroud includes a fan positioned to circulate air through the ventilation opening.

13. The cabinet system of claim 11, wherein the fan guard assembly includes a plurality of overlaid protective screens positioned over the ventilation opening.

14. A cabinet system, comprising:
a protective shroud defining a protected space and at least one opening for viewing into the protective shroud;
an external frame including a first plurality of rigid struts extending around the protective shroud, wherein at least one of the first plurality of rigid struts defines a first elongated track;
at least one mounting arm securable to a support structure and including a mounting foot, wherein the mounting foot is configured to receive a first fastener insertable into the first elongated track of the first plurality of rigid struts to slidably connect the external frame to the mounting arm; and
at least one window frame engagable to the protective shroud to retain at least one window pane over the opening of the protective shroud, wherein the window frame further includes a recessed mounting element for receiving at least one fastener insertable into a corresponding borehole on the lip of the protective shroud to secure the window frame to the protective shroud;
wherein the protective shroud includes at least one lip securable to the window frame.

15. The cabinet system of claim 14, wherein the lip of the protective shroud further includes a secondary locking feature that engages the fastener to movement of the fastener due to changing environmental conditions.

16. The cabinet system of claim 14, wherein the window frame further includes an access port positioned over the recessed mounting element for receiving and accessing the fastener.

* * * * *